United States Patent
Journot et al.

(10) Patent No.: US 11,162,188 B2
(45) Date of Patent: Nov. 2, 2021

(54) METHOD FOR PRODUCING A CRYSTALLINE LAYER IN A III-N COMPOUND BY VAN DER WAALS EPITAXY FROM GRAPHENE

(71) Applicant: COMMISSARIAT A L'ENERGIE ATOMIQUE ET AUX ENERGIES ALTERNATIVES, Paris (FR)

(72) Inventors: Timotee Journot, Gieres (FR); Berangere Hyot, Eybens (FR); Armelle Even, Rennes (FR); Amelie Dussaigne, Saint Hilaire de la Cote (FR); Bruno-Jules Daudin, La Tronche (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/629,467

(22) PCT Filed: Jul. 9, 2018

(86) PCT No.: PCT/FR2018/051723
§ 371 (c)(1),
(2) Date: Jan. 8, 2020

(87) PCT Pub. No.: WO2019/012215
PCT Pub. Date: Jan. 17, 2019

(65) Prior Publication Data
US 2021/0115589 A1   Apr. 22, 2021

(30) Foreign Application Priority Data
Jul. 11, 2017 (FR) ........................ 1756556

(51) Int. Cl.
*C30B 25/18* (2006.01)
*C23C 16/30* (2006.01)
(Continued)

(52) U.S. Cl.
CPC .......... *C30B 25/183* (2013.01); *C23C 16/303* (2013.01); *C30B 25/10* (2013.01); *C30B 29/403* (2013.01)

(58) Field of Classification Search
CPC ......... C30B 25/00; C30B 25/02; C30B 25/10; C30B 25/16; C30B 25/18; C30B 25/183;
(Continued)

(56) References Cited

U.S. PATENT DOCUMENTS

2010/0244087 A1* 9/2010 Horie ................ H01L 21/02458
257/103
2011/0263111 A1* 10/2011 Melnik ................. C23C 16/303
438/569
(Continued)

FOREIGN PATENT DOCUMENTS

WO    WO 2016/085890 A1   6/2016
WO    WO-2016085890 A1 * 6/2016   ....... H01L 21/02658

OTHER PUBLICATIONS

Park, et al. publication entitled "The effect of thermal annealing of graphene under ammonia atmosphere on its electrical properties and contact to p-GaN" Thin Solid Films, vol. 546, pp. 246-249 (2013) (Year: 2013).*
(Continued)

*Primary Examiner* — Kenneth A Bratland, Jr.
(74) *Attorney, Agent, or Firm* — Oblon, McClelland, Maier & Neustadt, L.L.P.

(57) ABSTRACT

The invention relates to a method for manufacturing a layer of interest (3) in a III-N crystalline compound by epitaxy from a layer of graphene (2), characterized in that it comprises, prior to a phase of nucleation of the layer of interest (3), a step of thermal treatment of the layer of graphene (2) in which it is subjected to a first temperature ($T_{tt}$) no lower than 1050° C. and to a stream of ammonia.

10 Claims, 4 Drawing Sheets

(51) Int. Cl.
  *C30B 25/10* (2006.01)
  *C30B 29/40* (2006.01)
(58) Field of Classification Search
  CPC ....... C30B 25/186; C30B 29/00; C30B 29/02;
       C30B 29/04; C30B 29/10; C30B 29/40;
       C30B 29/403; C30B 29/406; C23C 16/22;
       C23C 16/30; C23C 16/301; C23C 16/303
  USPC ............. 117/84, 88, 94, 101, 106, 902, 913,
       117/928–929, 937, 952
  See application file for complete search history.

(56) References Cited

U.S. PATENT DOCUMENTS

2015/0292111 A1* 10/2015 Grunder ................. C30B 25/10
                                                  257/615
2017/0260651 A1*  9/2017 Robinson .......... H01C 21/02491

OTHER PUBLICATIONS

Kim, et al. publication entitled "Principle of direct van der Waals epitaxy of single-crystalline films on epitaxial graphene," Nature Communications, vol. 5, pp. 1-7 (2014). (Year: 2014).*

Nepal et al., "Epitaxial Growth of III-Nitride/Graphene Heterostructures for Electronic Devices," Applied Physics Express, vol. 6, No. 6, 2013, XP055468950, 5 total pages.

Kim et al., "Principle of direct van der Waals epitaxy of single-crystalline films on epitaxial graphene," Nature Communications, vol. 5, 2014, pp. 1-7.

Fernandez-Garrido et al., "A growth diagram for plasma-assisted molecular beam epitaxy of GaN nanocolumns on Si(111)," Journal of Applied Physics, vol. 106, 2009, 4 total pages.

* cited by examiner

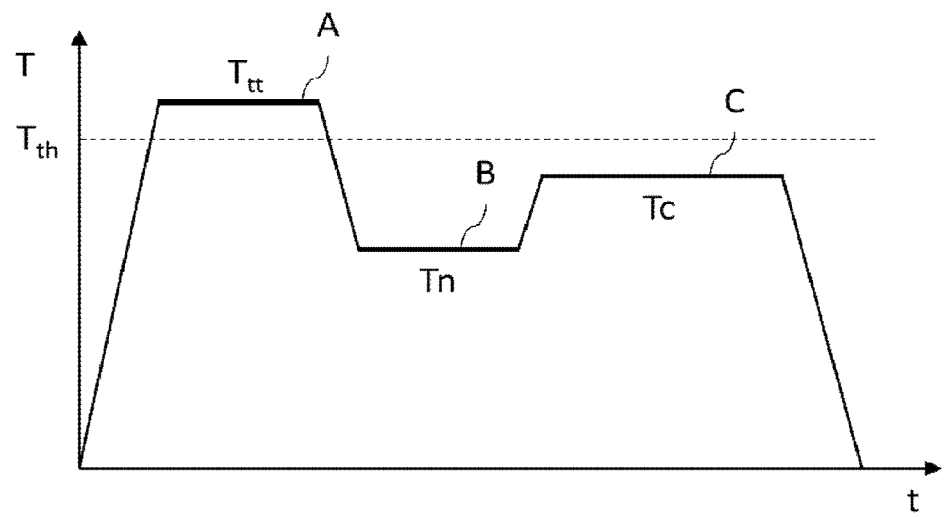
Fig.1A
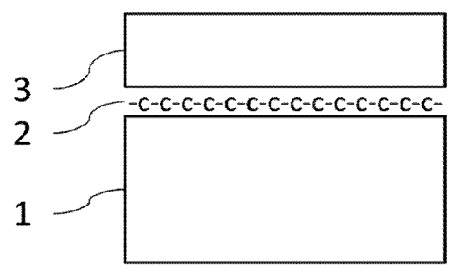
Fig.1B
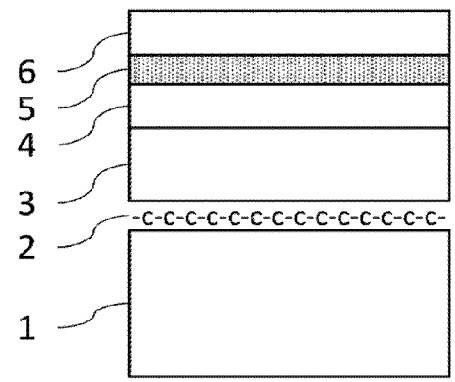
Fig.2
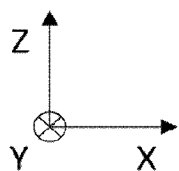

METHOD FOR PRODUCING A CRYSTALLINE LAYER IN A III-N COMPOUND BY VAN DER WAALS EPITAXY FROM GRAPHENE

TECHNICAL FIELD

The field of the invention is that of the epitaxial growth of a crystalline layer of a III-N compound from a graphene layer, the epitaxy then being van der Waals epitaxy. The invention applies in particular to the production of an electronic or optoelectronic device comprising such an epitaxial crystalline layer.

PRIOR ART

Generally speaking, the epitaxy of a crystalline material from a nucleation layer or from a growth substrate corresponds to the growth of this material so that its crystal lattice has an epitaxial relationship with that of the underlying material. In other words, the crystallographic orientations of the crystal lattice of the epitaxial material are aligned, in at least one direction in the plane of the material and at least one direction orthogonal to the plane of the material, with those of the crystal lattice of the nucleation material. The plane of the epitaxial material here is parallel to the nucleation plane. This is reflected in the fact that there is an agreement of crystallographic orientation and position between the crystal lattice of the epitaxial material and that of the nucleation material.

However, when the crystalline material has a different lattice parameter than the nucleation material, the crystal lattice of the epitaxial material then deforms, causing it to undergo mechanical stresses in tension or compression. Moreover, when the thickness of the epitaxial material exceeds a critical thickness value, mechanical stresses can relax plastically, resulting in the formation of structural defects such as dislocations of lattice mismatch. The lattice mismatch can be evaluated by the parameter m defined such that $m=(a_2-a_1)/a_1=\Delta a/a_1$ where $a_1$ and $a_2$ are respectively the lattice parameters of the nucleation material and of the epitaxial material measured in a plane parallel to the nucleation plane. The crystalline quality of the epitaxial layer is then degraded.

Thus, the epitaxial growth of a crystalline layer of a III-N compound, for example gallium nitride GaN or indium gallium nitride InGaN, can be carried out from, among others, a sapphire ($Al_2O_3$) or silicon substrate. However, GaN has a lattice mismatch of about 15% with sapphire, as well as a significant difference in the thermal expansion coefficient. The epitaxial GaN then presents mechanical stresses which, from a critical thickness of the layer, can relax plastically by forming dislocations. Such structural defects are likely to degrade the optical and/or electronic properties of a microelectronic or optoelectronic device with such an epitaxial layer.

In order to reduce structural defect density, the article by Kim et al. entitled *Principle of direct van der Waals epitaxy of single-crystalline films on epitaxial graphene*, Nat. Comm. 2014, 5:4836 describes the formation of a crystalline GaN layer by chemical vapor deposition from a graphene layer, which is formed on a silicon carbide SiC substrate. The epitaxial growth is van der Waals epitaxy insofar as the epitaxial GaN layer does not have any epitaxial relationships with the graphene layer. Kim 2014 also shows that the crystalline quality of the epitaxial GaN layer can be improved when the nucleation and growth phases are performed at high temperatures, respectively at 1100° C. and 1250° C.

DISCLOSURE OF THE INVENTION

The purpose of the invention is to produce a III-N compound layer of interest with improved crystalline quality by van der Waals epitaxy from a graphene layer. For this purpose, the subject matter of the invention is a process for fabricating a crystalline III-N compound layer of interest by epitaxy from a graphene layer, characterized in that it comprises, prior to a nucleation phase of the layer of interest, a step of heat treatment of the graphene layer in which it is subjected to a first temperature of 1050° C. or more and to a flow of ammonia. The fabrication process implicitly involves a step of obtaining a graphene layer resting on a support layer. Moreover, the layer of interest is a layer made of a crystalline material forming a III-N compound. A III-N compound is an alloy of nitrogen and at least one element from column III of the periodic table of elements.

Certain preferred but non-limiting aspects of this process are as follows.

The nucleation phase of the layer of interest can be performed at a second temperature below 1050° C.

The process may include, following the nucleation phase, a growth phase of the layer of interest at a third temperature above the second temperature and below 1050° C.

Ammonia can be a precursor of the nitrogen of the III-N compound during the nucleation and growth phases of the III-N compound of the layer of interest.

The graphene layer can be produced beforehand on a hexagonal silicon carbide-based support layer.

The graphene layer can consist of one to at most five graphene sheets.

The III-N compound can be selected from GaN, AlGaN, InGaN, InGaN, and AlInGaN.

The crystalline III-N compound can be deposited epitaxially by metal-organic chemical vapor deposition.

The III-N compound can be $In_{x1}Ga_{1-x1}N$ with an atomic proportion of indium x1 of 5% or more.

The invention also relates to a process for producing an optoelectronic device, comprising producing a layer of interest from the process according to any one of the preceding features, then producing from the layer of interest N and P doped layers between which an active zone is located, the active zone comprising at least one quantum well made from the III-N compound.

The III-N compound of the layer of interest can be InGaN with an atomic proportion of indium of 5% or more, and the active zone can be made from InGaN with an atomic proportion of indium of 15% or more.

BRIEF DESCRIPTION OF THE DRAWINGS

Other aspects, purposes, advantages and features of the invention will become clearer upon reading the following detailed description of the preferred embodiments, given by way of non-limiting example, and made with reference to the appended drawings in which:

FIG. 1A illustrates an example of temperature change for different steps of the process for fabricating a III-N compound layer of interest according to an embodiment, and FIG. 1B is a schematic cross-sectional view of an example of a layer of interest obtained by the fabrication process;

FIG. 2 is a partial schematic cross-sectional view of an optoelectronic device comprising a layer of interest obtained by the fabrication process according to an embodiment;

DETAILED DESCRIPTION OF SPECIFIC EMBODIMENTS

Figure 3A:
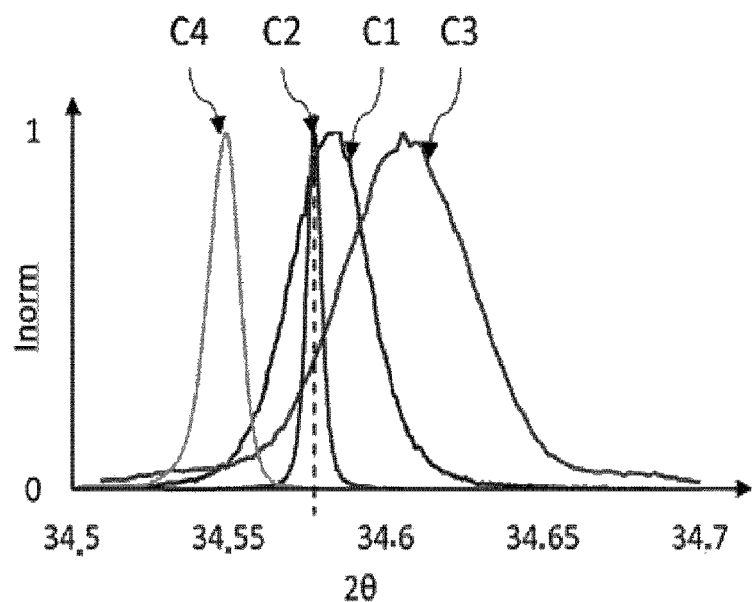
FIGS. 3A, 3B, 3C illustrate respectively X-ray diffraction spectra, photoluminescence spectra, and Raman spectra for a GaN layer of interest obtained by the fabrication process according to an embodiment and for different reference GaN layers.

In the figures and hereinbelow, the same reference characters represent the same or similar elements. Moreover, the various elements are not represented to scale in order to favor the clarity of the figures. Furthermore, the different embodiments and variants are not mutually exclusive and can be combined. Unless otherwise indicated, the terms "substantially", "about", "of the order of" mean to within 10%. Furthermore, the expression "comprising a" must be understood as "comprising at least one", unless otherwise indicated.

The invention relates to the production of a III-N compound layer of interest by van der Waals epitaxy from a graphene layer. Generally speaking, van der Waals epitaxy is a heteroepitaxy technique whereby a three-dimensional crystalline layer is bonded to a layer consisting of one or more sheets of two-dimensional material by van der Waals bonds and not by covalent bonds. The two-dimensional material can be selected from graphene, boron nitride, transition metal chalcogenides, among others. In the context of the invention, it is a layer of graphene. The van der Waals epitaxy notably makes it possible to avoid the lattice mismatch that may exist between the two-dimensional material and the epitaxial layer, this lattice mismatch being due to the difference between the lattice parameters of the two materials, thus making it possible to obtain a relaxed or almost relaxed epitaxial crystal layer. Such a crystalline layer obtained by van der Waals epitaxy then has a reduced density of structural defects such as lattice mismatch dislocations, thus optimizing the optical and/or electronic properties of a microelectronic or optoelectronic device comprising such a layer of interest.

The process for fabricating the layer of interest according to an embodiment is described with reference to FIG. 1A, which illustrates an example of temperature change for different steps of the fabrication process, and with reference to FIG. 1B, which illustrates an example of a layer of interest thus obtained.

The temperature considered in FIG. 1A corresponds to the temperature of the support layer at its upper surface on which the graphene layer rests. It also corresponds to the temperature of the graphene layer due to its very thin thickness. Temperature is usually measured, directly or indirectly, by means of a thermocouple and/or an infrared laser pyrometer.

Here and for the rest of the description, an orthogonal three-dimensional direct reference mark (X,Y,Z) is defined, where the X and Y axes form a plane parallel to the main plane along which the layer of interest extends, and where the Z axis is oriented in an orthogonal direction to the main plane of the layer.

In a first step, a support layer 1 is first provided in order to then form the graphene layer 2. The support layer 1 can consist of a thick layer of the same material, for example a bulk substrate, or a stack of distinct material layers such as a silicon-on-insulator (SOI) substrate. It can be made of an electrically insulating material, for example sapphire ($Al_2O_3$), or it can be made of a semiconductor material based on a III-V compound, a II-VI compound or a IV compound, for example silicon or silicon carbide. A III-V compound is an alloy consisting of at least one element from column III and at least one element from column V of the periodic table.

The choice of the material of the support layer 1 depends notably on the technique chosen to create the graphene layer. As such, the article by Avouris and Dimitrakopoulos entitled *Graphene: synthesis and applications*, Materials Today, March 2012, Vol. 15, No. 3, details two classic techniques for producing the graphene layer, namely the graphitization of a SiC substrate with a hexagonal crystal lattice by high-temperature vacuum annealing, and growth by chemical vapor deposition (CVD) from a metal surface under a gas flow containing carbon. In the second case, the graphene layer obtained on a growth substrate can be transferred to the support layer. By way of illustration, in a preferred example, the support layer 1 is a hexagonal SiC bulk substrate. As mentioned in the article by Kim et al. entitled *Principle of direct van der Waals epitaxy of single-crystalline films on epitaxial graphene*, Nat. Commun. 5:4836 (2014), the upper surface of the support layer 1 may have a surface structure in the form of landings or steps which may have a width of the order of a few tens of nanometers to a few microns, for example between 10 nm and 10 µm, preferably about 100 nm, and a height difference of the order of a few nanometers, for example between 1 and 10 nm, for example about 1 nm.

In a subsequent step, a graphene layer 2 is formed on the support layer 1. As mentioned above, it can be formed by graphitization on the SiC support layer, or it can be formed by deposition on a growth substrate and then transferred to the support layer 1. By way of illustration, in a preferred example, the graphene layer 2 is produced by graphitizing the hexagonal SiC support layer 1 under identical or similar operating conditions to those described in the Kim 2014 article mentioned above.

The graphene layer 2 thus covers a surface of the support layer 1. Graphene is a two-dimensional crystalline material consisting of a single sheet of carbon atoms arranged hexagonally to form a planar structure of one-atom thickness. A sheet here corresponds to a monoatomic layer. It is said to be two-dimensional insofar as it consists of one or more sheets of carbon atoms arranged to form a two-dimensional hexagonal crystal lattice. The graphene layer 2 may consist of a single graphene sheet or a few graphene sheets stacked on top of each other, for example up to five sheets. When it consists of no more than five sheets of carbon atoms, it is called graphene. When it consists of a stack of more than five sheets of carbon atoms, it is called graphite. Thus, the graphene layer 2 has a thickness preferably between 0.3 nm and 1.8 nm. If the support layer 1 has the surface structure mentioned above, the graphene layer 2 can also reproduce this structure with identical or similar dimensions.

In an optional step, annealing is carried out by bringing the graphene layer 2 to a temperature of the order of a few hundred degrees Celsius, for example at 800° C., for a period of the order of a few minutes. During this step, the graphene layer is not subjected to any flow of ammonia and precursor of the III element of the III-N compound of the layer of interest 3. It can be subjected to an environment of nitrogen ($N_2$) or hydrogen ($H_2$). This step ensures a surface treatment of the graphene layer in order to remove any impurities present, in particular adsorbates.

In a subsequent step A, a heat treatment is carried out by bringing the graphene layer to a temperature $T_{tt}$ greater than or equal to a threshold value $T_{th}$ equal to 1050° C. under a flow of ammonia $NH_3$. The ammonia flow can be between 1000 and 15000 sccm (standard cubic centimeters per minute), for example 7300 sccm. The duration of the heat treatment can be a few minutes, for example of the order of 4 or 5 minutes. The pressure can be a few hundred millibars, for example of the order of 600 to 800 mbar. The carrier gas can be nitrogen ($N_2$) or hydrogen ($H_2$). However, during this step, the heat treatment temperature $T_{tt}$ remains below the melting temperature of the graphene layer 2 and below the melting temperature of the support layer 1.

The threshold temperature $T_{th}$ may be greater than, or less than or equal to, a maximum value $Tn_{max}$ of nucleation of the III-N compound of the layer of interest 3. In the case where the threshold temperature $T_{th}$ is higher than the maximum nucleation temperature $Tn_{max}$, it is irrelevant whether the graphene layer 2 is also subjected to a flow of the precursor of the III element, for example to a flow of trimethylgallium TMGa or triethylgallium TEGa in the case where the III element is gallium. Indeed, beyond the maximum nucleation temperature $Tn_{max}$, the III-N compound cannot nucleate from the graphene layer 2, since, by definition, from the maximum nucleation temperature, the probability of desorption of the group III atoms is greater than their probability of adsorption on the graphene layer 2. Conversely, in the case where the threshold temperature $T_{th}$ is less than or equal to the maximum nucleation temperature $Tn_{max}$, the graphene layer 2 is not subjected to a flow of the precursor of the III element during this heat treatment step, thus avoiding the nucleation of the III-N compound.

By way of illustration, in a preferred example, the graphene layer 2 can be subjected to a heat treatment temperature $T_{tt}$ of 1075° C. for 5 min, under a pressure of 600 mbar, under an ammonia flow of 7300 sccm. Under these conditions, it appears that the heat treatment temperature $T_{tt}$ is higher than the maximum nucleation temperature $Tn_{max}$ of the III-N compound, which in this example is gallium nitride GaN. It is also possible to subject the graphene layer 2 to a flow of gallium precursor, for example TMGa. The ratio of $NH_3$ flow to TMGa flow can be equal here to 1340. In any case, since the heat treatment temperature $T_{tt}$ is here higher than the maximum nucleation temperature $Tn_{max}$, there is no nucleation of gallium nitride from the graphene layer 2. By way of illustration, as shown in the article by Fernandez-Garrido et al. entitled *A growth diagram for plasma-assisted molecular beam epitaxy of GaN nanocolumns on Si*(111), J. Appl. Phys., 106, 126102 (2009), it appears that above a temperature of about 840° C. in the case of plasma-assisted molecular beam epitaxy (PA-MBE), GaN can substantially not nucleate.

In a subsequent step, the growth of the III-N compound layer of interest 3 is carried out by van der Waals epitaxy from the graphene layer 2. It may include, as described here, a nucleation phase followed by an actual growth phase, these two phases being distinguished from each other by the growth conditions and in particular by the value of the growth temperature. Alternatively, the growth stage may not have distinct nucleation and growth phases.

Growth can be achieved by conventional epitaxy techniques such as chemical vapor deposition (CVD), for example metal-organic chemical vapor deposition (MOCVD), molecular beam epitaxy (MBE), hybrid vapor phase epitaxy (HVPE), atomic layer epitaxy (ALE), atomic layer deposition (ALD), or even by evaporation or sputtering. By way of illustration, in a preferred example, the growth process is MOCVD of a gallium nitride GaN layer of interest 3 on the graphene layer 2 which rests on a hexagonal SiC support layer 1.

In a first phase B, the nucleation of the III-N compound is carried out from the graphene layer 2 by MOCVD epitaxial growth. The temperature is then lowered to a value Tn lower than the maximum nucleation temperature $Tn_{max}$. According to an embodiment, the temperature Tn is also lower than the threshold temperature $T_{th}$ of 1050° C. The III-N compound then nucleates directly on the graphene layer 2 and is bound to it by weak van der Waals bonds and not by covalent bonds. The III-N compound can thus form nucleation or seed pads, distinct from each other, optionally in contact in pairs, spatially distributed on the surface of the graphene layer 2 in a random manner (see FIG. 4A by way of example). The nucleation pads of the III-N compound are in direct contact with the graphene layer 2, in the sense that there is no interlayer material between the III-N compound and the graphene layer 2.

The III-N compound intended to form the layer of interest 3 is made of a crystalline alloy containing nitrogen and at least one element from column III of the periodic table. The III-N compound can thus be, by way of illustration, selected from binary alloys such as gallium nitride GaN, aluminum nitride AlN, or even indium nitride InN, ternaries such as indium gallium nitride InGaN or aluminum gallium nitride AlGaN, or even quaternary alloys such as aluminum indium gallium nitride AlInGaN.

By way of illustration, in a preferred example, the nucleation temperature Tn here is 950° C. The $NH_3$/TMGa ratio of ammonia flow to gallium precursor flow is 1180 and the pressure is 300 mbar. The duration of this phase can be a few minutes, for example 5 min. Thus, a plurality of GaN nucleation pads (see FIG. 4A) are obtained by van der Waals growth directly from the graphene layer 2.

In a second phase C, the actual growth of the layer of interest 3 consisting of the III-N compound is carried out in order to obtain a layer extending substantially continuously over the graphene layer 2 and having a substantially constant final thickness. For this purpose, the temperature is increased to a so-called growth value Tc, higher than the nucleation value Tn, in order to increase the growth rate in the XY plane relative to the growth rate along the Z axis. According to an embodiment, the growth temperature Tc is also lower than the threshold temperature $T_{th}$ of 1050° C. The N/III ratio of nitrogen precursor flow to III element precursor flow, as well as the pressure, can remain unchanged. The duration of this phase can be from a few minutes to a few tens of minutes, or even more, as a function of the desired final thickness of the layer of interest. The final thickness can be between a few hundred nanometers to a few microns, or even a few tens or hundreds of microns.

By way of illustration, in a preferred example, the growth temperature Tc here is 1030° C. The $NH_3$/TMGa ratio of ammonia flow to gallium precursor flow is 1180 and the pressure is 300 mbar. The duration of this phase can be equal to 2 hours. This results in a GaN layer of interest with a thickness in the micron range.

Thus, insofar as the III-N compound layer of interest 3 is obtained by van der Waals epitaxy from the graphene layer 2, the layer of interest 3 has a crystal lattice which is not mechanically constrained by that of the graphene layer 2 or by that of the support layer 1. Thus, the effective lattice parameter of the layer of interest 3 is substantially equal to its natural value. This then results in a good relaxation of mechanical stresses in the layer of interest 3 along its entire thickness, leading to a low density of structural defects such as lattice mismatch dislocations resulting from a possible plastic relaxation of stresses.

Thus, the lattice mismatch between the III-N compound of the layer of interest 3 and the graphene layer 2 does not cause any substantial mechanical stresses in the layer of interest 3. It is then possible to produce a layer of interest 3 whose thickness is no longer limited by the critical thickness from which a plastic relaxation of the mechanical stresses usually occurs. Moreover, in the case where the III-N compound is a ternary or quaternary such as InGaN it is then possible to incorporate a high quantity of indium and thus obtain an alloy whose atomic proportion of indium is particularly high, for example of 5% or more, preferably equal to 20%. The atomic proportion of indium depends on the desired optical and/or electronic properties of the layer of interest 3. The same is true for the ternary AlGaN and the quaternary AlInGaN.

FIG. 2 illustrates, schematically and partially, an example of an optoelectronic device with such a III-N compound, for example InGaN, layer of interest. The optoelectronic device here includes the stack shown in FIG. 1B, namely the support layer 1, the graphene layer 2, and the InGaN layer of interest 3. This example is a planar light-emitting diode, but this device can be any other type of microelectronic or optoelectronic device.

The layer of interest 3 obtained by van der Waals epitaxy forms, in this example, an $In_{x1}Ga_{1-x1}N$ buffer layer with an atomic proportion of indium x1 of 5% or more, for example of about 18%. Such a value of the proportion of indium x1 is usually accessible only to the extent that the layer of interest 3 is substantially relaxed or for a thickness less than the critical thickness. Here, since the layer of interest is relaxed, its thickness is not limited by the value of the critical thickness. It can therefore be 10 nm or more, which is the order of magnitude of the critical thickness of the InGaN. It can thus be, for purely illustrative purposes, between 10 nm and 20 μm, for example between 500 nm and 10 μm, for example about 5 μm.

A first layer 4, doped according to a first conductivity type, for example n-doped, covers the layer of interest 3. It is made of a material based on the III-N compound, i.e. it is an alloy formed of at least the same elements as those of the III-N compound of the layer of interest 3. Preferably, it is made of n-doped InGaN, with an atomic proportion of indium substantially equal to x1, here 18%, and has a thickness which can, for purely illustrative purposes, be between 10 nm and 20 μm, for example between 500 nm and 10 μm, for example about 5 μm. Alternatively, the first doped layer 4 and the layer of interest 3 may not be distinct from each other and may thus form a single layer. In this case, the layer of interest 3 can be doped by incorporating dopants during its growth stage.

An active zone 5 is located between the two doped layers 4, 6. It is here a layer at which most of the light emitted by the light-emitting diode is emitted. It includes at least one quantum well made of a semiconductor compound whose bandgap energy is lower than that of the two doped layers 4, 6, and may thus include a single quantum well or multiple quantum wells, each interposed between barrier layers.

The layers forming the quantum wells, and preferably the barrier layers, are made of a semiconductor material based on the III-N compound, and preferably InGaN as the III-N compound, with different atomic proportions for the quantum wells and the barrier layers. By way of example, the barrier layers can be made of InGaN with an atomic proportion of indium of between 15% and about 23%, for example of about 18%, and quantum wells can also be made of InGaN with an atomic proportion of indium of between 22% and about 30%, for example of about 25%, making it possible here to obtain an emission wavelength of between 495 nm and 560 nm, for example of 500 nm. The light-emitting diode is then able to emit light radiation in the green, with good light efficiency insofar as the internal quantum efficiency is improved by limiting the lattice mismatch at the interfaces between the layers 3, 4, 5, 6, thus resulting in a reduced density of dislocation-type defects in the doped layers 4, 6 and the active zone 5.

A second layer 6, doped according to a second conductivity type opposite to the first type, for example here p-doped, covers at least part of the active zone 5. It is made of a material based on the III-N compound, and preferably is made of p-doped InGaN, with an atomic proportion of indium substantially equal to x1, here 18%. Its thickness can be, for purely illustrative purposes, between 10 nm and 20 μm, for example between 500 nm and 10 μm, for example about 5 μm.

An electron blocking layer (not shown) can be located between the active zone 5 and the second doped layer 6. It can consist of a ternary III-N compound, for example AlGaN or AlInN, advantageously p-doped. It increases the rate of radiative recombinations in the active zone.

First and second polarization electrodes (not shown) are in electrical contact respectively with the first doped layer 4 and the second doped layer 6. They make it possible to apply a difference in electrical potential to the optoelectronic device. Depending on their positioning, they can be made of a material that is electrically conductive and transparent to the light radiation emitted by the diode, for example indium tin oxide ITO. Thus, when a difference in electrical potential is applied to the pn junction in a direct direction, the diode emits light radiation whose emission spectrum has a peak intensity at a wavelength here of about 500 nm.

Thus, by obtaining a relaxed layer of interest 3 of a III-N compound, here InGaN, by van der Waals epitaxy from a layer of graphene 2, it is possible to substantially increase the thickness of the active zone and/or the atomic proportion of one of the elements of the alloy of the III-N compound of the diode, in this example the indium of the InGaN, and thus obtain a diode adapted to emit in the green on the one hand, with a high luminous efficiency on the other, since the internal quantum efficiency is improved. Moreover, as described below, the layer of interest 3 has an improved crystalline quality, which limits structural defect density equally in the doped layers 4, 6 and in the active zone 5, thus also improving the optoelectronic performance of the light-emitting diode.

Figure 3B:
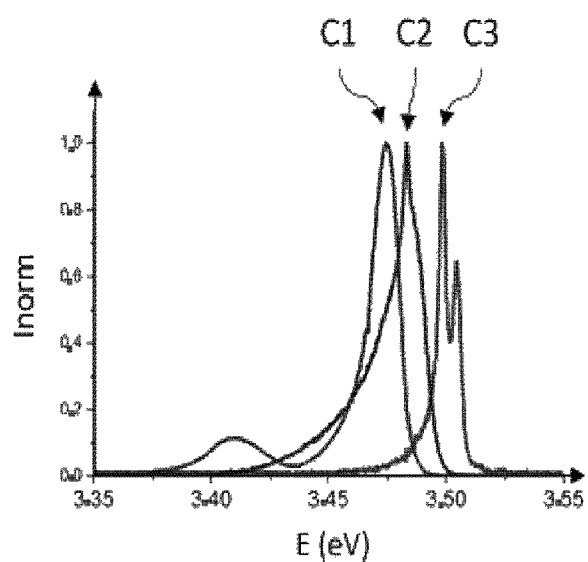
Figure 3C:
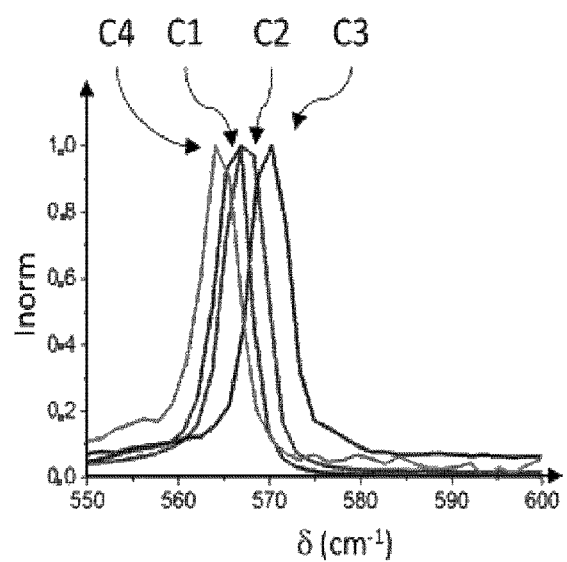

FIGS. 3A to 3C illustrate different characterizations of a layer of interest 3 obtained by the fabrication process according to an embodiment. These examples of characterizations of the layer of interest 3 demonstrate the absence or virtual absence of mechanical stresses, thus reflecting the relaxed state of the layer of interest 3. In this example, the layer of interest 3 is made of GaN, from a graphene layer 2 resting on a hexagonal SiC support layer, with the operating conditions mentioned above with reference to the preferred example.

FIG. 3A illustrates a comparison of the X-ray diffraction pattern of the layer of interest 3 obtained by the fabrication process according to an embodiment, with those of three reference GaN layers. In particular, the value of the angular position according to the 2θ angle of the [002] line of the GaN layer of interest 3 is compared with the reference layers. Thus, the curve C1 illustrates the X-ray diffraction intensity of the epitaxial GaN layer of interest 3 from the graphene layer obtained by the fabrication process according to an embodiment. The curve C2 is relative to a bulk and therefore relaxed GaN reference layer, the curve C4 to an epitaxial GaN reference layer directly from a sapphire support layer, and finally the curve C3 to an epitaxial GaN reference layer directly from a SiC support layer. It appears that the curve C1 of the layer of interest 3 has a peak intensity for a 2θ value that is substantially equal to that of the curve C2 for the relaxed GaN. Moreover, the curve C4 of the epitaxial GaN from sapphire shows that the GaN is under mechanical stress in compression, and the curve C3 of the epitaxial GaN from SiC indicates that the GaN is under mechanical stress in tension. Thus, the layer of interest 3 obtained from the fabrication process according to an embodiment has a virtual absence of mechanical stresses: the GaN is substantially relaxed here. Its effective lattice parameter is then substantially equal to its natural lattice parameter (3.189 Å) and does not correspond to that of the SiC material (3.080 Å) of the support layer 1 or that of graphene (2.460 Å).

FIG. 3B illustrates a comparison of the photoluminescence spectrum of the layer of interest 3 obtained by the fabrication process according to an embodiment, with those of two reference GaN layers. Thus, the curve C1 illustrates the photoluminescence intensity of the epitaxial GaN layer of interest 3 from the graphene layer 2 obtained by the fabrication process according to an embodiment. The curve C2 is relative to a bulk and therefore relaxed GaN reference layer, and the curve C3 to an epitaxial GaN reference layer directly from a sapphire support layer. Here again, it appears that the curve C1 of the layer of interest 3 has a photoluminescence peak for an energy value closer to that of the peak of the curve C2 (relaxed GaN) than that of the peak of the curve C3 (GaN in compression). The layer of interest 3 does indeed have a relaxed or substantially relaxed state.

FIG. 3C illustrates a comparison of the Raman spectrum of the $E^{(2)}_2$ line of the layer of interest 3 obtained by the fabrication process according to an embodiment, with those of three reference GaN layers. As before, the curve C1 illustrates the change in diffused light intensity of the epitaxial GaN layer of interest 3 from the graphene layer 2 obtained by the fabrication process according to an embodiment. The curve C2 is relative to a bulk and therefore relaxed GaN reference layer, the curve C3 to an epitaxial GaN reference layer directly from a sapphire support layer, and finally the curve C4 to an epitaxial GaN reference layer directly from a SiC support layer. Here again, it appears that the curve C1 of the layer of interest 3 has a diffusion peak for a Raman shift value closer to that of the peak of the curve C2 (relaxed GaN) than those of the peaks of the curve C3 (GaN in compression) and of the curve C4 (GaN in tension). The layer of interest 3 does indeed have a relaxed or substantially relaxed state.

Moreover, the inventors have thus demonstrated that the heat treatment step implemented before the growth step of the layer of interest 3, and therefore before the nucleation phase of the III-N compound, improves the crystalline quality of the III-N compound. The crystalline quality of the III-N compound can be demonstrated from the analysis of the presence and orientation of crystalline planes of the nucleation pads obtained following the nucleation phase. Indeed, the nucleation pads of the III-N compound can each have a substantially pyramidal or frustoconical shape with inclined surfaces, more precisely with semipolar surfaces, the latter connecting a hexagonal base to the top of the pad. This corresponds to the wurtzite (hexagonal) phase of the crystal structure in which III-N compounds are most thermodynamically stable.

Figure 4A:
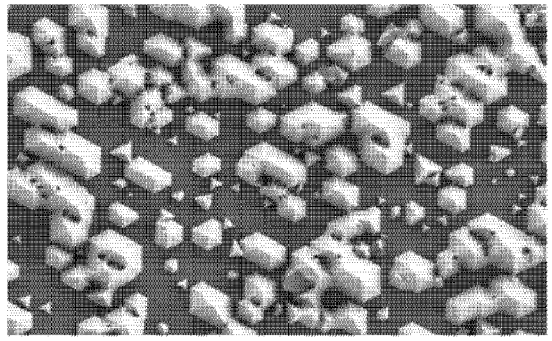
FIGS. 4A and 4B respectively illustrate a scanning electron micrograph (FIG. 4A) of nucleation pads obtained during a fabrication process according to an embodiment of the invention, and a Fourier transform (FIG. 4B) of the micrograph shown in FIG. 4A.
Figure 4B:
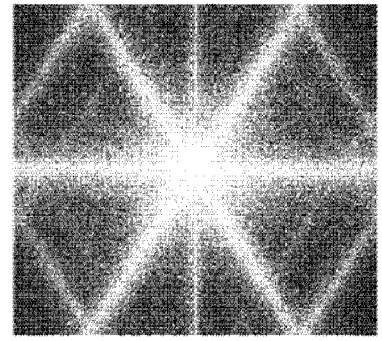

FIG. 4A is a scanning electron micrograph (SEM) of an example of III-N compound nucleation pads obtained as a result of the nucleation phase of the process according to an embodiment. FIG. 4B shows the fast Fourier transform (FFT) of the pixelated SEM shown in FIG. 4A. In this example, the III-N compound is epitaxial GaN from the graphene layer 2, which rests on a hexagonal SiC support layer 1. The fabrication process according to this embodiment thus includes the heat treatment step during which the graphene layer 2 is subjected to a temperature of 1050° C. or more, here about 1075° C., under an ammonia flow of 7300 sccm. The nucleation phase is then carried out at a nucleation temperature of 960° C. The N/III ratio is 1180, for an $NH_3$ flow of 7300 sccm and a TMGa flow of 277 μmol·min$^{-1}$. It appears that the seed pads each have a substantially pyramidal shape with a hexagonal base, whose semipolar surfaces, which are substantially planar, connect the base to the top of the pad. The Fourier transform of the SEM has six main lines, each corresponding to one of the semipolar surfaces of the seed pads. The fact that the contrast associated with the lines is high (high signal-to-noise ratio) reflects the good crystalline quality of the nucleation pads, and consequently of the layer of interest 3 then obtained.

Figure 5A:
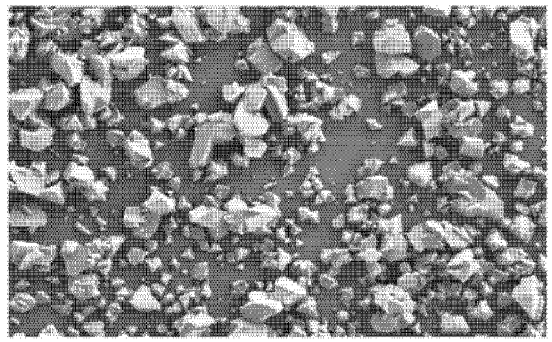
FIGS. 5A and 5B respectively illustrate a scanning electron micrograph (FIG. 5A) of nucleation pads obtained during a fabrication process that does not include a heat treatment step prior to the nucleation phase, and a Fourier transform (FIG. 5B) of the micrograph shown in FIG. 5A.
Figure 5B:
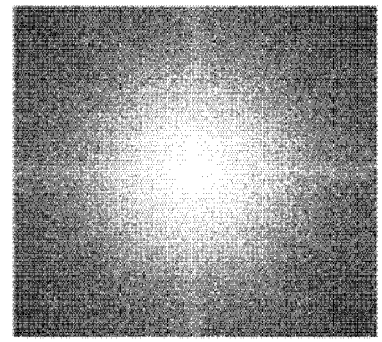

FIG. 5A is a scanning electron micrograph (SEM) of an example of nucleation pads of III-N compound obtained as a result of the nucleation phase of a fabrication process in which the heat treatment step is not performed. FIG. 5B shows the fast Fourier transform (FFT) of the pixelated SEM shown in FIG. 5A. In this example, the III-N compound is epitaxial GaN from the graphene layer 2, which rests on a hexagonal SiC support layer 1. The fabrication process thus includes a nucleation phase without any prior heat treatment step in the sense of the invention. As before, the nucleation phase is performed at a nucleation temperature of 960° C. The N/III ratio is 1180, for an $NH_3$ flow of 7300 sccm and a TMGa flow of 277 μmol·min$^{-1}$. It appears that the seed pads do not have the same crystal structure from one pad to another. Moreover, none of the pads have a substantially pyramidal shape with a hexagonal base and substantially planar semipolar surfaces. As a result, the Fourier transform of the SEM does not have distinguishable main lines, which reflects the low crystalline quality of the nucleation pads, and therefore of the layer of interest 3 that can then be obtained.

Figure 6A:
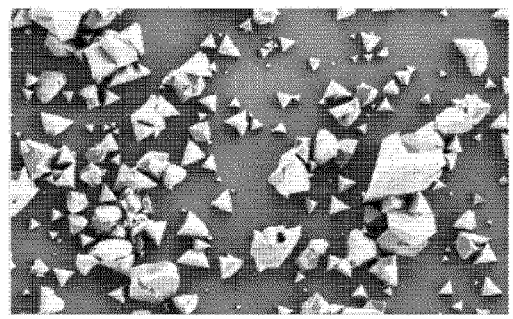
FIGS. 6A and 6B respectively illustrate a scanning electron micrograph (FIG. 6A) of nucleation pads obtained during a fabrication process involving a step of thermal annealing of the graphene layer without subjecting it to an ammonia flow, and a Fourier transform (FIG. 6B) of the micrograph shown in FIG. 6A.
Figure 6B:
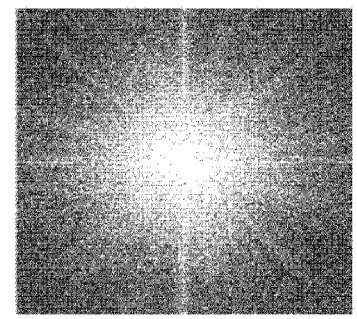

FIG. 6A is a scanning electron micrograph (SEM) of an example of nucleation pads of III-N compound obtained following the nucleation phase of a fabrication process in which a preliminary heat treatment step is performed, but without ammonia flow. FIG. 6B shows the fast Fourier transform (FFT) of the pixelated SEM shown in FIG. 6A. In this example, the III-N compound is epitaxial GaN from the graphene layer 2, which rests on a hexagonal SiC support layer 1. The fabrication process here includes a heat treatment step in which the graphene layer is subjected to a temperature of 1050° C. or more, in this case about 1075° C., but differs from the heat treatment in the sense of the invention in that the graphene layer is not simultaneously subjected to an ammonia flow. The nucleation phase is then carried out at a nucleation temperature of 960° C. The N/III ratio is 1180, for an $NH_3$ flow of 7300 sccm and a TMGa flow of 277 µmol·min$^{-1}$. It appears that the seed pads do not have the same crystal structure from one pad to another either, and do not have a substantially pyramidal shape with a hexagonal base and substantially planar semipolar surfaces. The Fourier transform of the SEM therefore has no distinguishable main lines, which confirms the poor crystalline quality of the nucleation pads, and consequently of the layer of interest that can then be obtained.

The inventors have thus shown that carrying out a heat treatment step at a temperature greater than or equal to a threshold temperature of 1050° C. under ammonia improves the crystalline quality of the seed pads of the III-N compound, and therefore the layer of interest 3 then obtained. These seed pads mainly have the same pyramidal type crystalline structure with a hexagonal base and substantially planar semipolar surfaces. Carrying out a heat treatment step above the threshold temperature of 1050° C., but without ammonia flow, does not produce seed pads of good crystalline quality. Similarly, subjecting the graphene layer to an ammonia flow but at a temperature below the threshold temperature of 1050° C. also does not produce good crystalline quality seed pads of the III-N compound.

Figure 7:
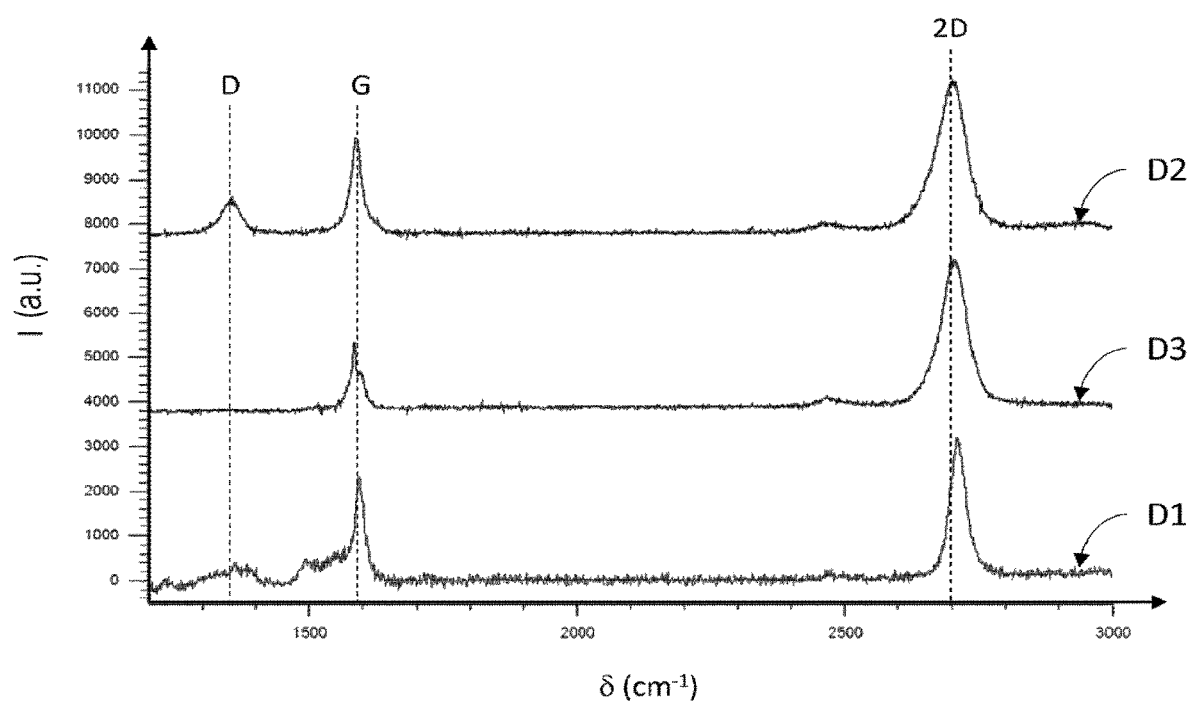
FIG. 7 illustrates Raman spectra for a graphene layer obtained on a support layer, for the same graphene layer after an annealing step and finally for the same graphene layer after the annealing and heat treatment steps.

FIG. 7 is a comparison of the Raman spectrum of the graphene layer 2 obtained after the heat treatment step of the fabrication process according to an embodiment, with those of two reference graphene layers. The curve D1 illustrates the Raman spectrum for the graphene layer 2 used in the fabrication process according to an embodiment, as obtained after its formation step. The curve D2 illustrates the Raman spectrum for the same graphene layer 2 used in the fabrication process according to an embodiment, after an annealing step at 800° C. (without ammonia flow). And the curve D3 illustrates the Raman spectrum for the same graphene layer 2 used in the fabrication process according to an embodiment, after the annealing step at 800° C. (without ammonia flow) and after the heat treatment step at 1075° C. under ammonia.

Generally speaking, the Raman spectrum of a graphene layer has a D-mode peak around 1350 cm$^{-1}$, a G-mode peak around 1600 cm$^{-1}$, and a 2D-mode peak around 2700 cm$^{-1}$. The D-mode peak is useful for assessing the crystal quality of the graphene layer: the higher the intensity, the more defects in the crystal structure of the graphene layer occur. The 2D-mode peak essentially provides information on the number of sheets of carbon atoms: the more sheets there are in the graphene layer, the more the peak widens.

These spectra show that the graphene layer 2 initially has a low D-mode peak (curve D1), and a more pronounced peak after the annealing step (curve D2), reflecting a possible degradation of the crystal structure of the graphene layer induced by the annealing step. However, after the heat treatment step (curve D3), it has a very low structural defect density since the spectrum no longer has a D-mode peak. The heat treatment step in which the graphene layer 2 is subjected to an ammonia flow and a temperature of 1050° C. or more thus seems to induce an improvement in the crystal quality of the graphene layer. This may influence the improvement of the crystalline quality of the III-N compound described above. Moreover, it appears that the peak associated with 2D modes remains substantially identical for the curves D1, D2 and D3, thus reflecting the absence of any change in the number of sheets of carbon atoms that form the graphene layer 2.

Specific embodiments have just been described. Different variants and modifications will become apparent to the skilled person.

The invention claimed is:

1. A process for fabricating a layer of interest of a crystalline III-N compound by epitaxy from a graphene layer, the process comprising:
    obtaining a graphene layer on a support layer;
    prior to a nucleation phase of the layer of interest:
    subjecting the supported graphene layer to an ammonia pressure of 600 to 800 mbar at a first temperature (Ttt) of 1050° C. or more;
    performing the epitaxy nucleation phase of the III-N compound on the ammonia treated supported graphene at a temperature (T2) below 1050° C.; and
    performing an epitaxy growth phase of the III-N compound on the ammonia treated supported graphene to obtain the crystalline III-N compound on the supported graphene layer.

2. The process of claim 1, wherein a temperature of the epitaxy growth phase is a third temperature (Tc) higher than the second temperature (T2) and lower than 1050° C.

3. The process of claim 2, wherein ammonia is a precursor of the nitrogen of the III-N compound during the nucleation and growth phases of the III-N compound of the layer of interest.

4. The process of claim 1, wherein the support layer comprises hexagonal silicon carbide (SiC).

5. The process of claim 1, wherein the graphene layer consists of one to at most five graphene sheets.

6. The process of claim 1, wherein the III-N compound is selected from the group consisting of GaN, AlGaN, InGaN, and AlInGaN.

7. The process of claim 1, wherein the crystalline III-N compound is deposited epitaxially by metal-organic chemical vapor deposition.

8. The process of claim 1, wherein the III-N compound is $In_{x1}Ga_{1-x1}N$ with an atomic proportion of indium x1 of 5% or more.

9. A process for fabricating an optoelectronic device, comprising fabricating a layer of interest by performing the process of claim 1, and then fabricating from the layer of interest N and P doped layers between which an active zone is located, the active zone comprising at least one quantum well made from the III-N compound.

10. The process of claim 9, wherein the III-N compound of the layer of interest is InGaN with an atomic proportion of indium of 5% or more, and the active zone is made from InGaN with an atomic proportion of indium of 15% or more.

* * * * *